(12) United States Patent
Altwasser

(10) Patent No.: US 6,333,721 B1
(45) Date of Patent: Dec. 25, 2001

(54) IDENTIFICATION ELEMENT AND METHOD OF MANUFACTURING AN IDENTIFICATION ELEMENT

(75) Inventor: Richard Altwasser, Oxford (GB)

(73) Assignee: Meto International GmbH, Hirschhorn (DE)

( * ) Notice: Subject to any disclaimer, the term of this patent is extended or adjusted under 35 U.S.C. 154(b) by 0 days.

(21) Appl. No.: 09/502,828

(22) Filed: Feb. 11, 2000

(30) Foreign Application Priority Data

Feb. 11, 1999 (DE) .............................. 199 05 886

(51) Int. Cl.$^7$ ...................................... H01Q 21/00
(52) U.S. Cl. .................. 343/867; 343/742; 343/895; 340/505
(58) Field of Search .................. 343/741, 742, 343/866, 868, 895, 867; 340/505, 572

(56) References Cited

U.S. PATENT DOCUMENTS 5,574,470 * 11/1996 de Vall .................................. 343/895
6,140,146 * 10/2000 Brady et al. ........................... 438/62

FOREIGN PATENT DOCUMENTS

| | | |
|---|---|---|
| 4017217A1 | 12/1991 | (DE) . |
| 4407810A1 | 9/1995 | (DE) . |
| 0595549A2 | 5/1994 | (EP) . |
| 737935A2 | 10/1996 | (EP) . |
| WO 98/26372 | 6/1998 | (WO) . |

* cited by examiner

*Primary Examiner*—Don Wong
*Assistant Examiner*—Shih-Chao Chen
(74) *Attorney, Agent, or Firm*—Jones, Tullar & Cooper, P.C.

(57) ABSTRACT

The present invention is directed to a method and an identification element (8) comprising an integrated circuit and an antenna coil disposed on a substrate. With respect to the identification element, it is proposed that the conducting track/conducting tracks of the antenna coil be die-stamped from an aluminum foil, that terminal pads referred to as bumps projecting from the undersurface of the integrated circuit be formed on the contacts of the integrated circuit, and that at least in the area of the bumps provision is made for a substance which, as a result of a defined volume reduction occurring during curing, produces a compressive and/or tensile force between the integrated circuit and the substrate so that the bumps are connected to the antenna coil by a press contact.

16 Claims, 3 Drawing Sheets

IDENTIFICATION ELEMENT AND METHOD OF MANUFACTURING AN IDENTIFICATION ELEMENT

FIELD OF THE INVENTION

This invention relates to an identification element comprising an integrated circuit with contacts and an antenna coil (RF/ID transponder), the antenna coil comprising at least one conducting track having at least one turn, and being electrically connected to the integrated circuit. The integrated circuit and the antenna coil are arranged on a substrate. Furthermore, the present invention relates to a method of manufacturing an identification element of this type.

BACKGROUND OF THE INVENTION

The advantage of RFID transponders compared to the bar-codes predominantly used in particular in the goods marking sector is that they permit a direct exchange of information, meaning that no visual contact is needed between the interrogating device and the transponder for the information transfer. Unlike bar-codes, furthermore, it is an easy matter with RF/ID transponders to change their information content directly as and when required.

RF/ID transponders find application in the most diverse fields. For example, they lend themselves to employment particularly in the fields of production, further processing, handling and protection of merchandise as well as in the personal security sector and the identification marking of animals.

The disadvantage of the known RF/ID transponders compared to bar-codes is the immense difference in price between the two identifiers. This is also the reason why the use of RF/ID transponders in the sales sector has been restricted so far to fringe areas. In particular there has been no interest to date in using RF/ID transponders to present price information or other data on mass products in department stores and warehouses because of the relatively high cost involved.

A method of bonding an integrated circuit to a resonant circuit mounted on a flexible substrate and a corresponding transponder are described in European Patent EP 0 821 406 A1. The resonant circuit is formed of two electrically conductive patterns arranged on either side of the flexible substrate. The resonant circuit has a predetermined inductance and a predetermined capacitance.

To ensure a reliable bond between the integrated circuit and the resonant circuit, the bonding area on the flexible substrate is first cleaned. Then the integrated circuit is connected to the resonant circuit by a technique referred to as wire bonding which is known from semiconductor technology. To prevent the bond from being destroyed by external impact, a protective coating is applied to the integrated circuit and the bonding area.

One disadvantage of this known method and known transponder resides in the relatively high production cost. A factor contributing to the high cost is also the absolute need to apply subsequently a protective coating to the integrated circuit and in particular to the bonding area between the integrated circuit and the resonant circuit, because otherwise the risk exists that the bond could be destroyed during use.

For many applications it is absolutely necessary for the transponders to be readily integrable into labels. Because the transponder according to the known solution is substantially thicker in the area of the chip than in the remaining areas, this presents major printing problems when printing labels with a label printer. A further disadvantage of the known solution resides in that the conducting tracks forming the resonant circuit are produced by etching. Etching is a relatively expensive process which, in addition, poses a severe environmental pollution problem.

From European Paten EP 0 595 549 B1 a remote-readable identification tag has become known in which electrical contact between the chip and the antenna is established by means of an electrically conducting adhesive (flip-chip bonding). In this type of bonding isotropic and anisotropic electrically conductive adhesive substances find application. To this end, the electrically conductive adhesive substance is applied to the antenna in the bonding area. The bonding areas of the chip are pressed into the electrically conductive adhesive; subsequently the adhesive is allowed to cure by the application of heat.

The problem involved in this method is that it is necessary to effect a metered application of the electrically conductive adhesive to a locally defined site on the antenna structure. Application is typically effected by screen printing which is a disadvantage because remnants of the expensive electrically conductive adhesive invariably remain in the application screens as residues.

Furthermore, curing of the adhesives requires a certain amount of energy. Considering, however, that for the heat treatment only limited maximum temperatures may be used, this has an adverse effect on the cycle time required for curing the adhesive substances. The result is again the undesirably high production cost.

One variant of flip-chip bonding utilizes adhesives in which electrically conducting particles are distributed at random in such low concentration that the adhesive is practically non conducting (anisotropic adhesives). As electrically conductive particles precious metals as, for example, palladium, silver or gold are used. Gold or nickel plated plastic pellets are also known, however. On account of the relatively large surface available and the elastic properties of the plastic material used, pellets have favorable bonding properties because of the availability of a correspondingly large bonding surface and also because the elastic restoring forces cause an intimate contact to be established between the conducting track and the surface of the contact points. In cases where also the chip contact points are made of a precious metal as, for example, gold, and the chip contact points are subsequently pressed onto the antenna through the adhesive substance, it will be obvious that also such electrically conducting particles distributed in the adhesive are present between the respective sites on the chip and the antenna needing to be bonded, hence ensuring the intended electrical connection. An undeniable disadvantage of flip-chip bonding is the relatively high expense for the adhesive substances.

A problem occurring in particular when using aluminum as a material for the antenna coil is the oxide layer developing on the surface of the conducting tracks as soon as they come into contact with the oxygen in the air. Aluminum oxide being a very hard substance and known as an insulator, it is of course highly undesirable in connection with bonding.

SUMMARY OF THE INVENTION

It is an object of the present invention to provide an economically priced identification element and a method of manufacturing such an identification element.

With respect to the identification element of the present invention this object is accomplished in that the conducting track/the conducting tracks of the antenna coil is/are die-stamped from an aluminum foil, that terminal pads referred to as bumps projecting from the undersurface of the integrated circuit are formed on the contacts of the integrated circuit, and that between the integrated circuit and the antenna coil provision is made for a substance which, as a result of a defined volume reduction occurring during curing, produces a compressive and/or tensile force so that the bumps are connected to the antenna coil by a press contact.

The distinct advantage of the solution of the present invention over the prior art which proposes electrically conductive adhesives for the bonding of integrated circuit and antenna coil, resides in that the expensive adhesive substances with the anisotropically or isotropically distributed conductive particles can be dispensed with. The adhesives finding employment according to the present invention merely have to satisfy the requirement for volume reduction during curing. This requirement is met with many adhesives as soon as their state changes from liquid to solid or as soon as they cool from a higher to a lower temperature. By suitable selection of the adhesive substance and/or the amount of adhesive substance used it is possible to adjust the intensity of the press contact between bumps and antenna coil to a defined value. Still further it is advantageous, because economical, that the conducting track/the conducting tracks of the antenna coil is/are die-stamped from a metal foil. Therefore the solution of the present invention is relatively economical. A method of manufacturing such conducting tracks is known in the art from European Paten EP 0 665 705 A1. The method described in this Offenlegungsschrift is also usable with preference in connection with the manufacture of the antenna coils used for the identification element of the present invention.

According to an advantageous further provision of the identification element of the present invention, the bumps are essentially made of palladium. Palladium is relatively cheap and has the requisite hardness.

In a preferred configuration of the identification element of the present invention, the surface of the bumps bonded to the surface of the antenna coil has a predetermined surface roughness. The surface roughness is at least 5 µm. The advantage of this configuration is that due to the surface roughness any materials present between the antenna coil and the bump, which impede bonding, are broken up and, where applicable, displaced out of the bonding area by the contact pressure. Such annoying materials may include, for example, contaminants caused by the contact-bond substance which is responsible for the contact pressure between the antenna coil and the integrated circuit. A further example of annoying substances includes the presence of organic protective layers on the conducting track. An oxide film as intermediate layer is particularly disturbing. Thus an oxide film develops on the surface of conducting tracks made of aluminum as soon as the conducting tracks come into contact with the oxygen in the air. Aluminum oxide is a very hard substance and known as an insulator which of course presents major bonding problems.

To break up this aluminum oxide layer to thereby ensure reliability of operation of the identification element of the present invention, the roughened palladium surface of the bumps is eminently suitable. Basically the surface roughness structure of the bumps may be of any desired configuration. For example, it may be configured as a crown structure. However, a wedge-shaped, conical or pyramidal configuration is equally well conceivable.

According to an advantageous further aspect of the identification element of the present invention, the contact-bond substance is a pasty or liquid adhesive or an adhesive foil.

Another favorable aspect includes arranging the substance so that at least those areas in which the bumps are connected with the antenna coil are sealed gas-tight. This enables any atmospheric environmental impact to be largely precluded.

According to a preferred embodiment of the identification element of the present invention, the antenna coil is comprised of a lower conducting track and an upper conducting track, the two tracks being arranged so that they overlap at least in selected areas; furthermore, provision is made for a dielectric layer which is disposed at least in selected areas between the two conducting tracks.

In a still further advantageous aspect of the identification element of the present invention, provision is made for the two conducting tracks to be electrically interconnected in an area of track overlap. Furthermore, it is proposed in a further extension of this aspect to bond the integrated circuit between the lower conducting track and the upper conducting track.

For increased stability and resistance of the identification element of the present invention, it is proposed in an advantageous embodiment that a coating be provided for sealing the surface of the identification element or at least parts thereof. The coating involved may be a shrink-on foil, for example. A lacquer coating may also be contemplated.

With regard to the method of the present invention for manufacturing the identification element, the object is accomplished by die-stamping the conducting track/the conducting tracks of the antenna coil from an aluminum foil, by forming terminal pads referred to as bumps on the contacts of the integrated circuit, the bumps projecting from the undersurface of the integrated circuit, and by applying at least in the area of the bumps a substance which, as a result of a defined volume reduction occurring during curing, produces a compressive and/or tensile force between the integrated circuit and the substrate whereby the bumps are connected to the antenna coil by a press contact.

According to an advantageous aspect of the method of the present invention, the bumps are fabricated essentially from palladium using a currentless deposition technique. Furthermore, the bump surface bonded to the antenna coil is roughened. Preferably the roughness amounts to at least 5 µm. In a last optional step the identification element is coated with a protective foil at least in the area of the integrated circuit.

BRIEF DESCRIPTION OF THE DRAWINGS

The present invention will be explained in more detail in the following with reference to the accompanying drawing. In the drawing.

DESCRIPTION OF THE PREFERRED EMBODIMENT

Figure 1:
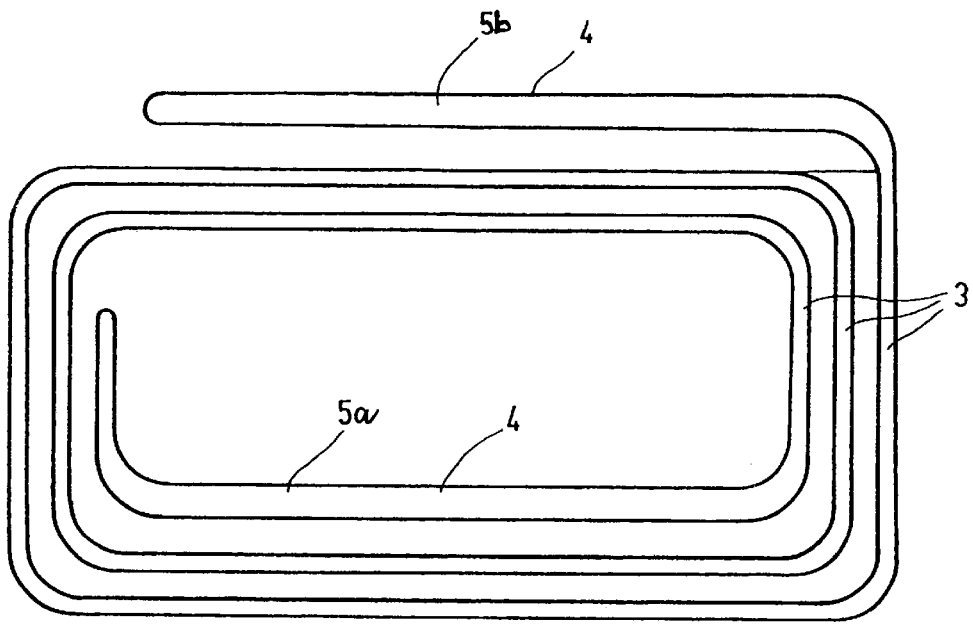
FIG. 1 is a top plan view of the lower conducting track.
Figure 2:
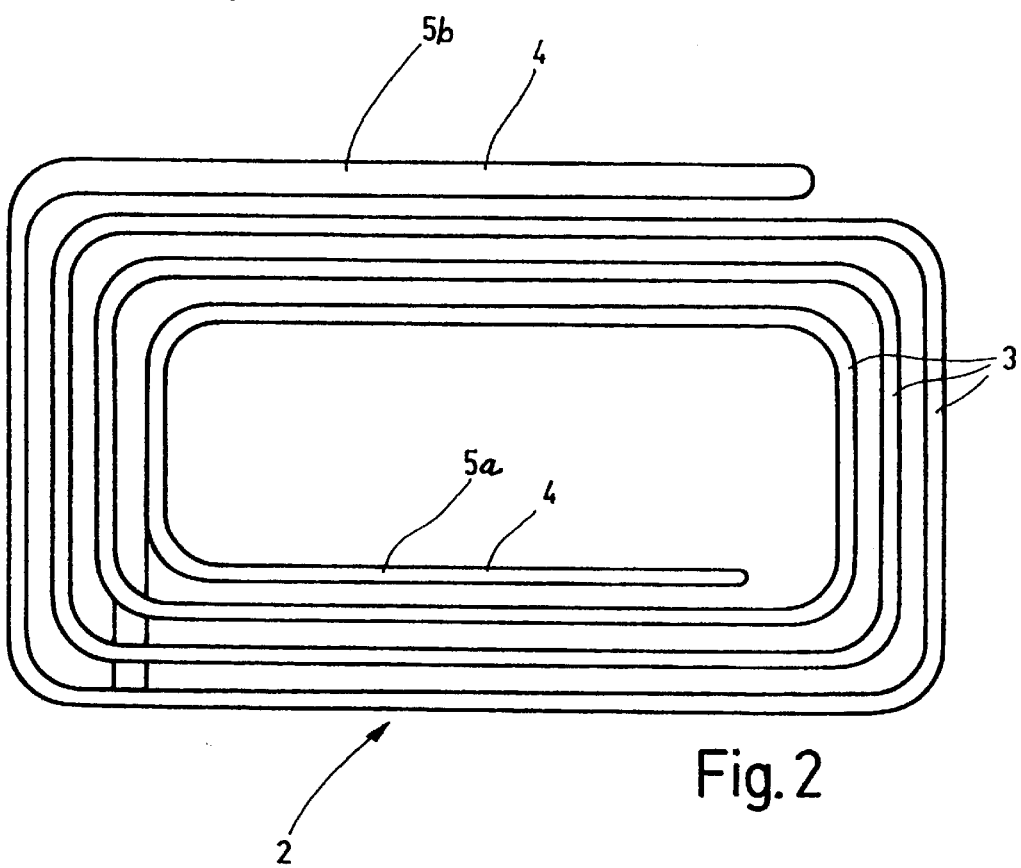
FIG. 2 is a top plan view of the upper conducting track.

FIG. 1 shows a top plan view of the lower conducting track 1 of the antenna coil 7. While the lower track 1 has nearly three turns 3, the upper track 2—as becomes apparent from the top plan view of FIG. 2—has nearly four turns 3. The relatively high number of turns results in a high inductance, ultimately providing a sufficiently high induced voltage for activating the integrated circuit 6. The two tracks 1, 2 are wound in opposing directions.

Figure 3:
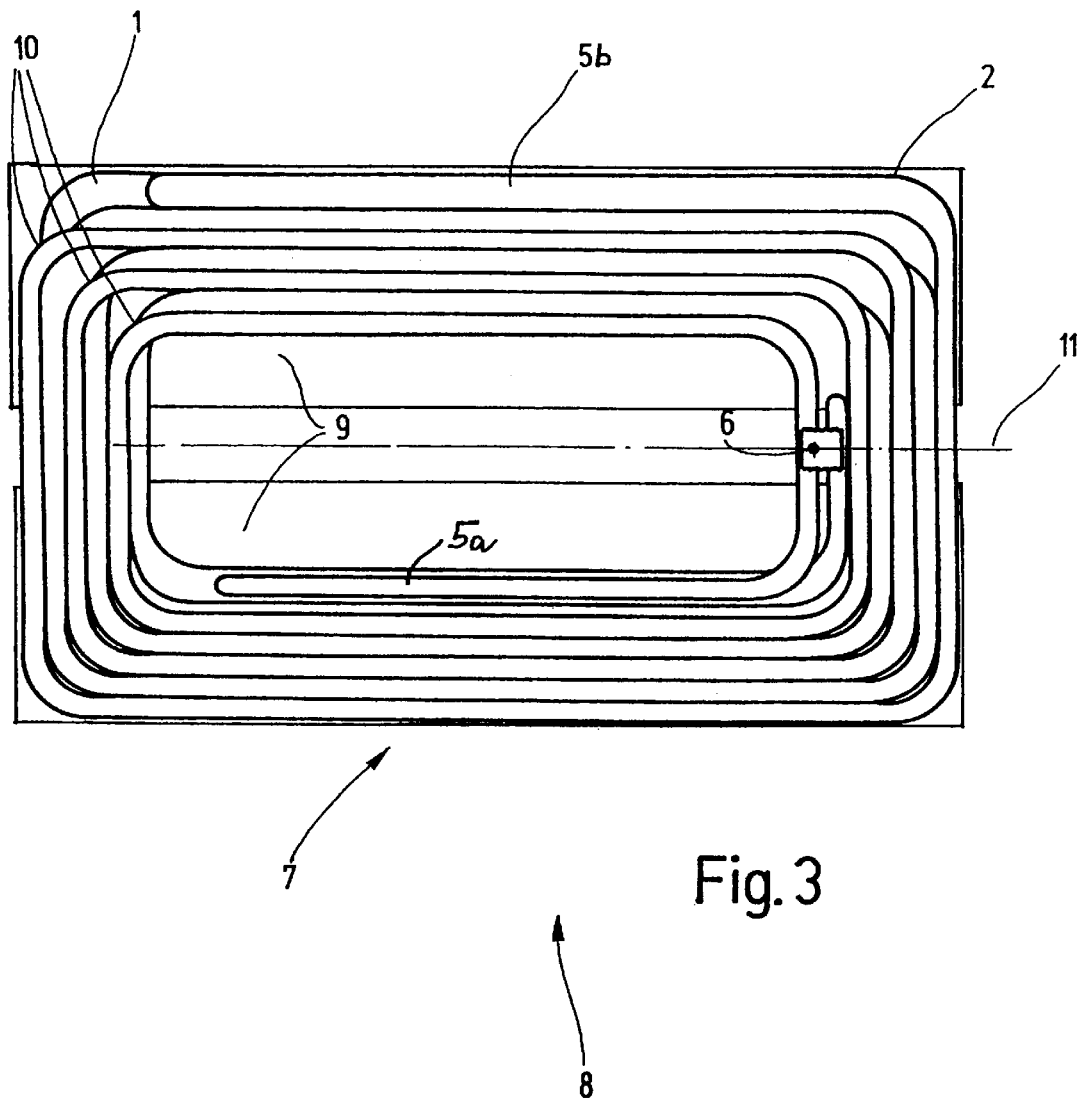
FIG. 3 is a top plan view of a configuration of the identification element of the present invention.

FIG. 3 shows the complete identification element 8, formed the two conducting tracks 1, 2.

The inner end 5a and the outer end 5b of the lower track 1 and the outer end 5b of the upper track 2 are of greater width than the balance of the tracks 1, 2. The two tracks 1, 2 are die-stamped from an aluminum foil.

In order to obtain the antenna coil 7, a dielectric layer 4 is arranged between the two tracks 1, 2. The two tracks 1, 2 are arranged in such relative position that they overlap essentially in selected areas 5a, 5b only. According to a preferred embodiment, the two tracks 1, 2 electrically interconnected in the overlap area 5b of the outer turns 3. In the simplest case, bonding is performed by punching through the two tracks in the area of track overlap 5b. Other bonding methods are equally applicable, however.

The dielectric layer 4 interposed between the two tracks 1, 2 is preferably a dielectric hot-melt adhesive. The dielectric layer 4 provides for electrical isolation of the two tracks 1, 2. On account of the offset positioning of the two tracks 1, 2, the main contribution of the capacitance is made by the areas of track overlap 5a, while the contributions to the total capacitance made by the remaining overlap areas 10, in which the two tracks 1, 2 intersect, are negligibly small. With this configuration, the capacitance and hence the energy of the antenna coil 7 is concentrated at a point where it is needed, that is, in the immediate vicinity of the chip.

The integrated circuit 6, meaning the preferably non-encapsulated chip 6, is disposed between the inner end of the lower track 1 and the inner end of the upper track 2 in the immediate vicinity of the center line 11 of the antenna coil 7. Bonding is effected between the chip 6 and the tracks 1, 2.

To prevent a short circuit from occurring in the overlap areas 10 which would deactivate the antenna coil 7 and with it the identification element 8, provision is made for an additional dielectric foil 9 or some other additional dielectric layer at least in these particular areas 10.

Figure 4:
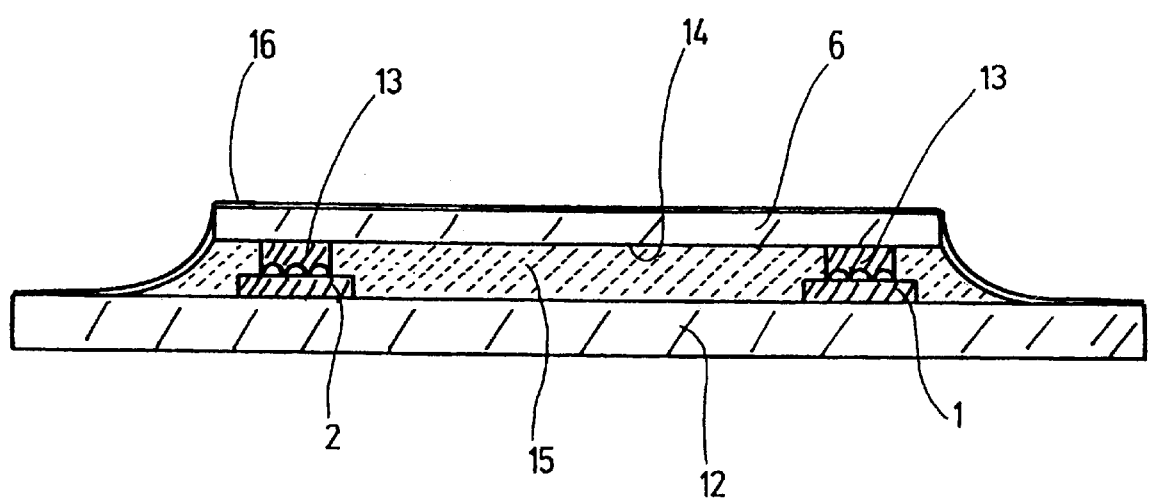
FIG. 4 is a cross sectional view taken along line IV—IV of FIG. 3, of the identification element in the area of the integrated circuit.

FIG. 4 shows a cross section of the identification element 8 in the area of the integrated circuit 6. The integrated circuit 6 is provided with bumps 13 projecting from its undersurface 14.

A conducting track 1; 2; 1, 2 is applied to a substrate 12 fabricated, for example, from PVC or PET. As described in the foregoing, the conducting track 1, 2 is die-stamped preferably from an aluminum foil. A relatively thin layer of a contactbond substance 15, for example, an adhesive, is applied in the area of the integrated circuit 6 between the substrate 12 and the undersurface 14 of the integrated circuit 6. In addition to its customary bonding characteristics, this contact-bond substance 15 has also the property of experiencing a defined volume reduction during curing. The curing process can be accelerated by the supply of energy. As a result of the volume reduction of the contact-bond substance 15 an intimate and biased tensile force is obtained between the integrated circuit 6 and the substrate 12. This causes the projecting bumps 13 of the integrated circuit 6 to be pressed against conducting track 1, 2.

The surface of the bumps 13 coming into contact with the conducting track 1, 2 is structured. On the ones hand, this breaks up any undesired layer which interferes with the electrical interconnection between the integrated circuit 6 and the conducting track 1, 2. On the other hand, the structuring of the contact surface of the bumps 13 provides for enhanced interlocking, hence improving the electrical connection at a low contact resistance in the contact area. According to the present invention a metal bond can be accomplished by means of a cold pressure weld.

The structure of the contact surface of the bumps 13 may vary widely. Aside from a crown structure the surface may also be of a wedge-shaped, conical or pyramidal configuration.

What is claimed is:

1. An identification element, comprising:
   a substrate;
   an integrated circuit with contacts and terminal pads formed on and projecting from said contacts;
   an antenna coil comprising at least one conducting track die-stamped from aluminum foil, having at least one turn, said antenna coil being electrically connected to said integrated circuit, said integrated circuit and said antenna coil being arranged on said substrate; and
   a substance situated between said integrated circuit and said substrate, which, as a result of a defined volume reduction occurring during curing, produces one of: a compressive force, and a tensile force so that said terminal pads are connected to said antenna coil by a press contact.

2. The identification element as defined in claim 1, wherein said terminal pads are essentially made of palladium.

3. The identification element as defined claim 1, wherein the surface of said terminal pads bonded to the surface of said antenna coil has a predetermined surface roughness.

4. The identification element as defined in claim 3, wherein said roughness is at least 5 $\mu$m.

5. The identification element as defined in claim 1, wherein said substance is one of: a pasty liquid adhesive and a foil.

6. The identification element as defined in claim 1, wherein said substance is situated such that at least those areas in which said terminal pads are connected with said antenna coil are sealed gas-tight.

7. The identification element as defined in claim 1, further comprising:
   a dielectric layer, wherein said antenna coil includes an upper conducting track and a lower conducting track, arranged so that they overlap at least in selected areas, and wherein said dielectric layer is disposed at least in said selected areas between said conducting tracks.

8. The identification element as defined in claim 7, wherein said dielectric layer is a dielectric adhesive layer, wherein said conducting tracks are interconnected by said dielectric adhesive layer.

9. The identification element as defined in claim 7, wherein said conducting tracks are electrically interconnected in the area of track overlap.

10. The identification element as defined in claim 7, wherein said integrated circuit is bonded to said conducting tracks.

11. The identification element as defined in claim 1, further comprising:
    a coating for sealing at least a part of the surface of said identification element.

12. A method of manufacturing an identification element, including: a substrate; an integrated circuit with contacts and terminal pads; an antenna coil having at least one conducting track with at least one tun; and a substance, the method comprising the steps of:
    die-stamping the conducting tracks from aluminum foil;

forming the terminal pads on the contacts to project therefrom;

arranging the integrated circuit and the antenna coil on the substrate, and electrically connecting them; and applying, at least in the area of the terminal pads the substance which, as a result of a defined volume reduction occurring during curing, produces one of: a compressive force, a tensile force, and a compressive and tensile force between the integrated circuit and the substrate whereby the terminal pads are connected to the antenna coil by a press contact.

13. The method as defined in claim 12, further comprising the step of:

fabricating the terminal pads essentially from palladium using a currentless deposition technique.

14. The method as defined in claim 12, further comprising the step of:

roughening the surface of the terminal pads for bonding to the surface of the antenna coil.

15. The method as defined in claim 14, wherein said roughening is at least 5 $\mu$m.

16. The method as defined in claim 12, further comprising the step of:

applying a coating to the identification element at least in the area of the integrated circuit.

* * * * *